(12) United States Patent
Kim

(10) Patent No.: US 12,288,596 B2
(45) Date of Patent: Apr. 29, 2025

(54) SEMICONDUCTOR MEMORY DEVICE, PROCESSING SYSTEM INCLUDING THE SAME AND POWER CONTROL CIRCUIT FOR THE SAME

(71) Applicant: SK hynix Inc., Icheon-si (KR)

(72) Inventor: Chang Hyun Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 185 days.

(21) Appl. No.: 18/102,597

(22) Filed: Jan. 27, 2023

(65) Prior Publication Data

US 2023/0197118 A1 Jun. 22, 2023

Related U.S. Application Data

(62) Division of application No. 17/191,499, filed on Mar. 3, 2021, now Pat. No. 11,600,308.

(30) Foreign Application Priority Data

Sep. 25, 2020 (KR) ........................ 10-2020-0124672

(51) Int. Cl.
*G11C 7/00* (2006.01)
*G11C 5/04* (2006.01)
(Continued)

(52) U.S. Cl.
CPC ................ *G11C 5/147* (2013.01); *G11C 5/04* (2013.01); *H01L 25/0657* (2013.01); *H01L 2225/06541* (2013.01)

(58) Field of Classification Search
CPC ....... G11C 5/04; G11C 5/147; G11C 11/4074; G11C 5/063; G11C 5/025; G11C 5/14; G11C 8/12; G11C 11/2297; G11C 16/30; G11C 11/4093; G11C 7/1084; G11C 11/4085; G11C 11/4096; G11C 7/1057; G11C 8/08; G11C 5/145; G11C 16/12; G11C 16/34; G11C 8/10; H01L 2225/06541; H01L 25/0657;
(Continued)

(56) References Cited

U.S. PATENT DOCUMENTS 7,131,033 B1 10/2006 Roper et al.
8,473,653 B2 6/2013 Kondo et al.
(Continued)

FOREIGN PATENT DOCUMENTS

KR 1020060065793 A 6/2006
KR 100610009 B1 8/2006
(Continued)

*Primary Examiner* — Thong Q Le
(74) *Attorney, Agent, or Firm* — WILLIAM PARK & ASSOCIATES LTD.

(57) ABSTRACT

A semiconductor memory device may include a plurality of memory cells wherein identifiers may be provided to the memory cells. The semiconductor memory device may include a first circuit, a second circuit and a power control circuit. The first circuit may include a first power terminal and a second power terminal. The second circuit may include a third terminal and a fourth terminal. The power control circuit may be configured to apply a first power voltage or a ground voltage to the first power terminal and to apply the ground voltage to the second power terminal based on the identifiers.

5 Claims, 9 Drawing Sheets

(51) Int. Cl.
*G11C 5/14* (2006.01)
*H01L 25/065* (2023.01)

(58) Field of Classification Search
CPC .......... H01L 2225/06513; H01L 25/18; H01L 2224/16145; H01L 2224/16146; H01L 2224/17181; H01L 2224/32145; H01L 2924/1436; H01L 2225/06517; H01L 2924/15311; H01L 2224/16225; H01L 2224/06181; H01L 2224/09181; H01L 2224/48227; H01L 2224/73265; H01L 2224/80895; H01L 2224/80896; H01L 2225/0651; H01L 2225/06544; H01L 2225/06562; H01L 2225/06565; H01L 2225/06582; H01L 23/481; H01L 23/5252; H01L 23/5256; H01L 24/80; H01L 25/50; H01L 2924/1441; H01L 24/10; H01L 2924/15192; H01L 2224/73204; H01L 2224/8592; H01L 2224/13025; H01L 2224/16227; H01L 2224/32225; H01L 2224/45099; H01L 24/13; H01L 24/17; H01L 24/48; H01L 2924/00012; H01L 2924/00014; G06F 13/1668; G06F 1/10; G06F 1/263; G06F 12/0238

See application file for complete search history.

(56) References Cited

U.S. PATENT DOCUMENTS

| | | | |
|---|---|---|---|
| 9,324,452 | B2 | 4/2016 | Yoon |
| 9,478,502 | B2 | 10/2016 | Satoh |
| 9,928,205 | B2 | 3/2018 | Kim et al. |
| 10,050,017 | B2 | 8/2018 | Kim |
| 10,319,451 | B2 | 6/2019 | Loh et al. |
| 10,340,255 | B2 | 7/2019 | Kim |
| 11,062,786 | B2 | 7/2021 | Chung |
| 2021/0225423 | A1* | 7/2021 | Moon ................ G11C 11/4074 |

FOREIGN PATENT DOCUMENTS

| | | |
|---|---|---|
| KR | 101416315 B1 | 7/2014 |
| KR | 1020170050057 A | 5/2017 |
| KR | 1020170059616 A | 5/2017 |
| KR | 1020170061275 A | 6/2017 |

* cited by examiner

SEMICONDUCTOR MEMORY DEVICE, PROCESSING SYSTEM INCLUDING THE SAME AND POWER CONTROL CIRCUIT FOR THE SAME

CROSS-REFERENCE TO RELATED APPLICATION

The present application is a divisional application of U.S. patent application Ser. No. 17/191,499, filed on Mar. 3, 2021, and claims priority under 35 U.S.C. § 119(a) to Korean application number 10-2020-0124672, filed on Sep. 25, 2020, in the Korean Intellectual Property Office, which is incorporated herein by reference in its entirety.

BACKGROUND

1. Technical Field

Various embodiments may generally relate to a semiconductor integrated device, more particularly to a semiconductor memory device, a processing system including the semiconductor memory device, and a power control circuit for the processing system.

2. Related Art

A multi-chip packaging technology may be a technology for packaging a plurality of semiconductor chips into one package.

According to related art, one memory chip may be packed to form a single chip package memory. Recently, a plurality of memory chips may be stacked to form a multi-chip package memory in accordance with requirements of a small size, a light weight, a high capacity, etc. Further, an arrangement technology having a three-dimensional stacked structure may be developed to improve an integration degree so that a capacity of a memory device having a small size may be increased.

In the stacked type memory device, the chips may be electrically connected with each other using various manners. For example, the chips may be electrically connected with each other using a connection via such as a through silicon via (TSV).

However, the memory device having the high capacity may have a high current consumption, a high power consumption, and/or a high heating value, which may decrease an operational capacity of the memory device.

SUMMARY

In example embodiments of the present disclosure, a semiconductor memory device may include a plurality of memory cells to which an identifier may be provided. The semiconductor memory device may include a first circuit, a second circuit and a power control circuit. The first circuit may include a first power terminal and a second power terminal. The second circuit may include a third power terminal and a fourth power terminal. The power control circuit may be configured to apply a first power voltage or a ground voltage to the first power terminal and to apply the ground voltage to the second power terminal based on the identifier.

In example embodiments of the present disclosure, a processing system may include a base die; and at least one core die stacked on the base die and coupled to the base die through a connection via, the core die including a plurality of memory cells to which identifiers are assigned, respectively. The core die comprises: a first circuit including a first power terminal and a second power terminal; a second circuit including a third power terminal and a fourth power terminal; and a power control circuit configured to apply a first power voltage or a ground voltage to the first power terminal and the ground voltage to the second power terminal based on the identifiers.

In example embodiments of the present disclosure, a processing system may include a base die; and a stacked structure stacked on the base die and coupled to the base die through a connection via, the stacked structure including a plurality of memory cells to which identifiers are assigned, respectively. The stacked structure comprises: a master core die directly stacked on the base die, the master core die including a first circuit and a second circuit, a first power terminal of the first circuit configured to receive a first power voltage, a second power terminal of the first circuit configured to receive a ground voltage, a third power terminal of the second circuit configured to receive a second power voltage and a fourth power terminal of the second circuit configured to receive a ground voltage; and at least one slave core die stacked on or over the master core die, the slave core die including a first circuit and a second circuit, a first power terminal of the first circuit configured to receive a ground voltage, a second power terminal of the first circuit configured to receive a first power voltage, a third power terminal of the second circuit configured to receive a second power voltage and a fourth power terminal of the second circuit configured to receive a ground voltage.

In example embodiments of the present disclosure, a power control circuit may be used for a plurality of memory dies configured to form a stacked chip package, wherein identifiers are assigned to the memory dies. Each of the memory dies includes a first circuit and a second circuit, the power control circuit including: a die determination circuit configured to determine stack positions of the memory dies based on the identifiers of the memory dies to output a die attribute signal; and a current regulation circuit configured to apply a first power voltage or a ground voltage to a first power terminal of the first circuit and apply the ground voltage to a second power terminal of the first circuit based on the die attribute signal.

In example embodiments of the present disclosure, a power control circuit for a plurality of memory dies, the memory dies may be configured to form a stacked chip package. Identifiers are assigned to the memory dies, and each of the memory dies includes a first circuit and a second circuit, the first circuit having a first power terminal and a second power terminal. The power control circuit may include: a die determination circuit configured to determine stack positions of the memory dies based on the identifiers of the memory dies to output a die attribute signal; and a current regulation circuit that includes a switch configured to connect the first power terminal with the second power terminal or disconnect the first power terminal from the second power terminal in response to the die attribute signal, wherein a ground voltage may be applied to the first power terminal and the second power terminal to cut off current consumption of the first circuit in response to the die attribute signal.

BRIEF DESCRIPTION OF THE DRAWINGS

The above and other aspects, features and advantages of the subject matter of the present disclosure will be more clearly understood from the following detailed description taken in conjunction with the accompanying drawings, in which.

DETAILED DESCRIPTION

Various embodiments of the present invention will be described in greater detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present invention as defined in the appended claims.

Figure 1:
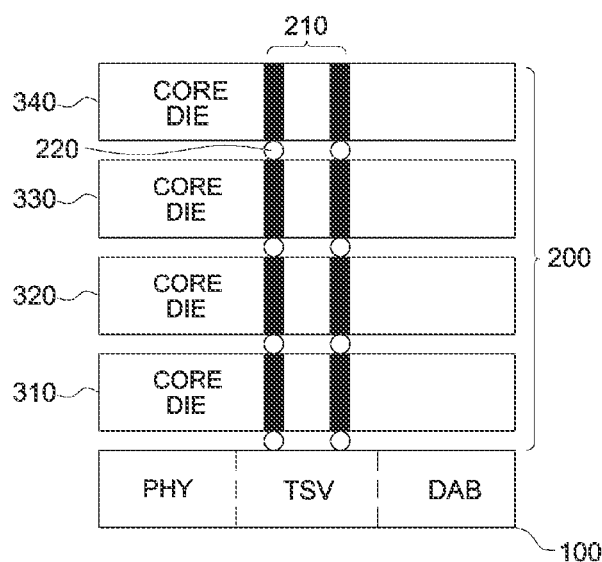
FIG. 1 is a block diagram illustrating a stacked type semiconductor memory device in accordance with example embodiments.

FIG. 1 is a block diagram illustrating a stacked type semiconductor memory device in accordance with example embodiments.

Referring to FIG. 1, a stacked type semiconductor memory device 10 of example embodiments may include a base die 100 and a stacked structure 200 stacked on the base die 100. The stacked structure 200 may include a stacked chip package including a plurality of core dies 310, 320, 330 and 340 sequentially stacked.

In example embodiments, the semiconductor memory device 10 may include a high bandwidth memory (HBM) structure or a hybrid memory cube (HMC) structure in which the base die 100 and the stacked structure 200 may be electrically connected with each other through a connection via 210 such as a TSV and a connection bump 220 to increase numbers of input/output units, thereby widening a bandwidth. The connection bump 220 may include a micro bump.

A plurality of memory cells configured to store data and circuits configured to operate the memory cells may be arranged in each of the core dies 310, 320, 330 and 340. Each of the core dies 310, 320, 330 and 340 may include a memory region corresponding to at least one channel. The core dies 310, 320, 330 and 340 may receive a signal, a power, etc., from the base die 100 through the connection via 210 corresponding to the channel.

The base die 100 may perform various functions of the semiconductor memory device 10. For example, the base die 100 may enable a power management function performed by partially activating the memory cells, thus enabling a timing control function between the core dies 310, 320, 330 and 340 and the base die 100.

The base die 100 may receive a command, an address, data, etc., from a controller. The base die 100 may then transmit the command, the address, the data, etc., to the core dies 310, 320, 330 and 340.

The base die 100 may include a physical region PHY, a connection via region TSV and a test electrode region DAB.

The physical region PHY may be an input/output region of an address, a command, data, a control signal, etc. The physical region PHY may include input/output circuits, input/output terminals, a power supply terminal and an impedance control circuit. Numbers of the input/output circuits may be determined in accordance with a data-processing speed required in the semiconductor memory device 10. The input/output terminals may be configured to receive signals for input/output operations. The power supply terminal may be configured to receive a power.

The test electrode region DAB may include an interface circuit by which a memory controller may directly access the semiconductor memory device 10. The interface circuit may include a direct access ball and an output driver.

The connection via region TSV may perform a signal-processing operation, for example, a buffering operation with respect to a signal received from the physical region PHY or a test signal received from the test electrode region DAB. The connection via region TSV may then transmit a buffered signal to the core dies 310, 320, 330 and 340 through the connection via TSV.

In example embodiments, the stacked structure 200 may include a master core die 310 and slave core dies 320, 330 and 340. The master core die 310 may be arranged at a lowermost layer of the stacked structure 200. The master core die 310 may be directly stacked on the base die 100. The slave core dies 320, 330 and 340 may transmit and receive signals with the base die 100 through the master core die 310. Identifications may be provided to the core dies 310, 320, 330 and 340 of the stacked structure 200. The master core die 310 may have a structure substantially the same as that of the slave core dies 320, 330 and 340. Since the structure of the master core die is the substantially the same as that of the slave core dies, each 310, 320, 330, 340 is labelled CORE DIE in FIG. 1. The slave core dies 320, 330 and 340 may be classified as the master core die 310 in accordance with stack positions.

The master core die 310 may process the command, the address and the data transmitted from the base die 100. For example, the master core die 310 may buffer the command, the address and the data. The master core die 310 may decode the command. Further, the master core die 310 may transmit the command, the address and the data to the slave core dies 320, 330 and 340 through the connection via TSV. The master core die 310 may transmit signal-processing results to the base die 100. Further, the master core die 310 may receive signal-processing results of the slave core dies 320, 330 and 340 through the connection via 210. The master core die 310 may then buffer the signal-processing results of the slave core dies 320, 330 and 340 followed by transmitting the buffered results to the base die 100.

Therefore, the master core die 310 may include a circuit for buffering or decoding the signal transmitted from the base die 100 or the slave core dies 320, 330 and 340. The circuit may be activated to perform the buffering operation or the decoding operation. In contrast, because the slave core dies 320, 330 and 340 may be operated by receiving the signal and the command from the master core die 310 to output the signal-processing results to the master core die 310, a circuit for buffering or decoding the signal may not be activated.

According to example embodiments, a current consumption of a non-used circuit in the slave core dies 320, 330 and 340 may be blocked to reduce a current consumption and a power of the semiconductor memory device 10.

Figure 2:
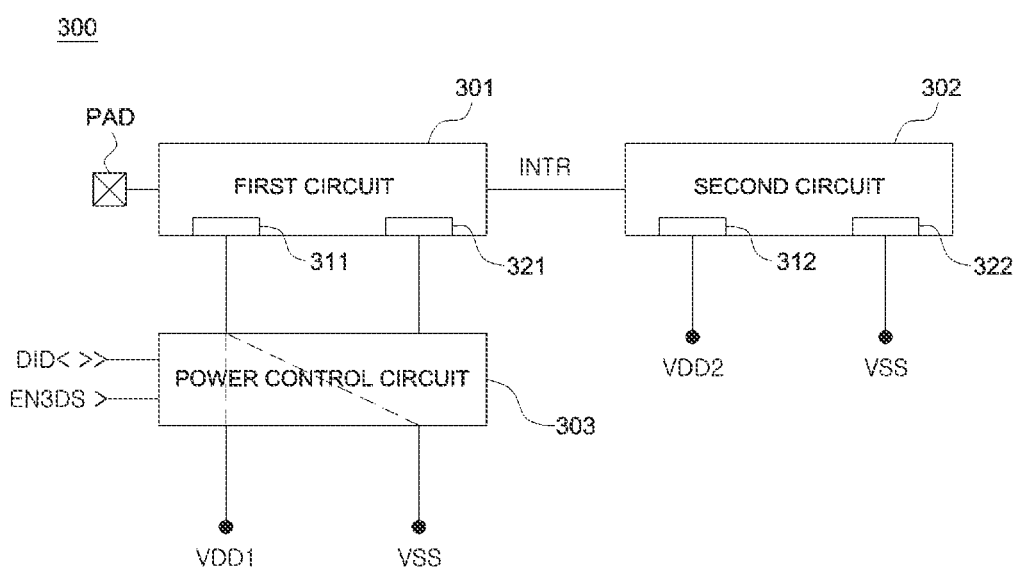
FIG. 2 is a block diagram illustrating a core die in accordance with example embodiments.

FIG. 2 is a block diagram illustrating a core die in accordance with example embodiments.

Referring to FIG. 2, a core die 300 of example embodiments may include a first circuit 301, a second circuit 302 and a power control circuit 303.

The first circuit 301 may include a buffering circuit configured to buffer signals through a pad PAD, a decoder configured to interpret a buffered command, etc. The first circuit 301 may include a first power terminal 311 and a second power terminal 321.

The power control circuit 303 may be configured to apply a ground voltage VSS to the second power terminal 321 of the first circuit 301. The power control circuit 303 may be configured to apply a first power voltage VDD1 or a ground voltage VSS to the first power terminal 311 of the first circuit 301 based on an attribute of the core die 300.

In example embodiments, the attribute of the core die 300 may be determined in response to a die ID DID< > and a stack enable signal EN3DS. The stack enable signal EN3DS may be activated when the core die 300 may form the stacked structure 200 with another core die.

The second circuit 302 may receive an internal signal INTR provided from the first circuit 301 to perform set operations. The second circuit 302 may receive a second power voltage VDD2 and a ground voltage VSS through a third power terminal 312 and a fourth power terminal 322, and may be operated based on the received voltages.

When the core die 300 in FIG. 2 may be used as the master core die 310, the first circuit 301 may function as a signal buffering circuit or a decoding circuit. Thus, the power control circuit 303 may apply the first power voltage VDD1 to the first power terminal 311 and the ground voltage VSS to the second power terminal 321.

When the core die 300 in FIG. 2 may be used as the slave core dies 320, 330 and 340, the first circuit 301 may not be used to implement the signal buffering or the decoding. In this case, the power control circuit 303 may apply the ground voltage VSS to the first power terminal 311 and the second power terminal 321 to control a current consumption of about 0 for the first circuit 301.

Figure 3:
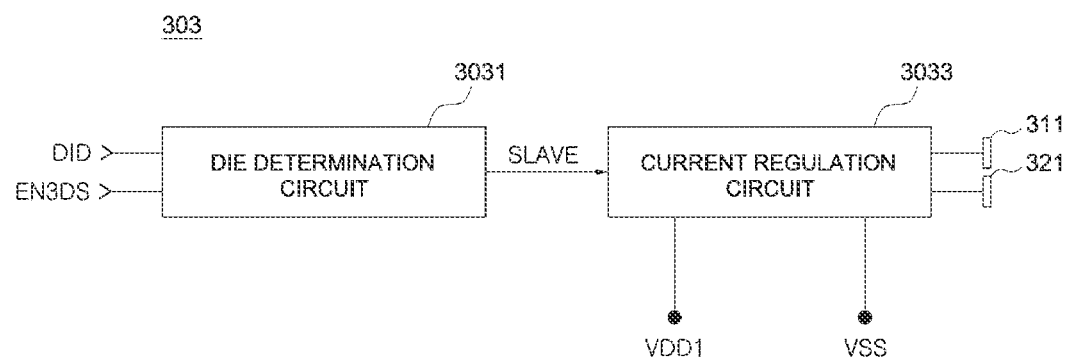
FIG. 3 is a block diagram illustrating a power control circuit in accordance with example embodiments.

FIG. 3 is a block diagram illustrating a power control circuit in accordance with example embodiments.

Referring to FIG. 3, a power control circuit 303 of example embodiments may include a die determination circuit 3031 and a current regulation circuit 3033.

The die determination circuit 3031 may output a die attribute signal SLAVE in accordance with whether the core die is a master die 310 or one of slave dies 320, 330 and 340 in response to the die ID DID< > and the stack enable signal EN3DS.

The current regulation circuit 3033 may apply the ground voltage VSS to the second power terminal 321 of the first circuit 301. The current regulation circuit 3033 may apply the first power voltage VDD1 or the ground voltage VSS to the first power terminal 311 in response to the die attribute signal SLAVE.

When the die ID DID< > may represent the master core die 310 and the stack enable signal EN3DS may be activated, the current regulation circuit 3033 may apply the first power voltage VDD1 to the first power terminal 311.

When the die ID DID< > may represent the slave core dies 320, 330 and 340 and the stack enable signal EN3DS may be activated, the current regulation circuit 3033 may apply the ground voltage VSS to the first power terminal 311.

That is, the power control circuit 303 may apply the ground voltage VSS to the first power terminal 311 and the second power terminal 321 of the slave core dies 320, 330 and 340 stacked on the master core die 310. The power control circuit 303 may apply the first power voltage VDD1 to the first power terminal 311 of the master core die 310 and the ground voltage VSS to the second power terminal 321 of the master core die 310 under the slave core dies 320, 330 and 340.

Figure 4:
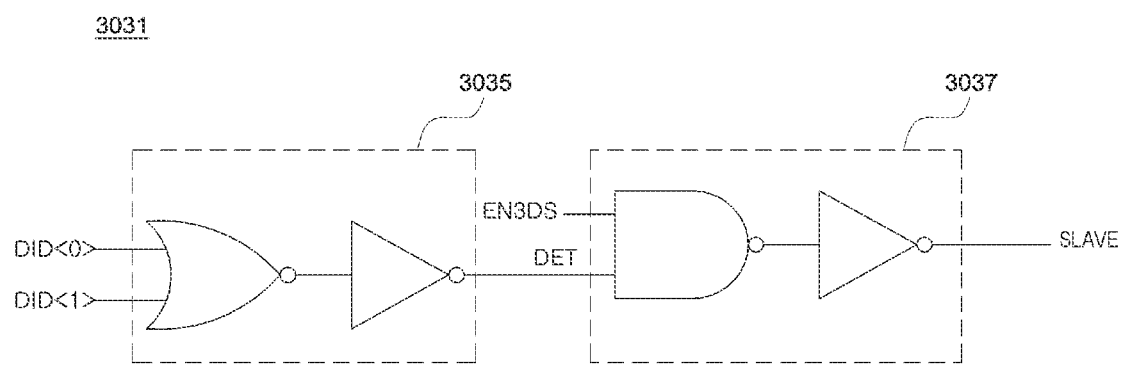
FIG. 4 is a view illustrating a die determination circuit in accordance with example embodiments.

FIG. 4 is a view illustrating a die determination circuit in accordance with example embodiments.

Referring to FIG. 4, the die determination circuit 3031 may include a slave core die identifier 3035 and a stack state identifier 3037.

The slave core die identifier 3035 may receive a die ID DDID<0:1> to output a determination signal DET that determines whether a corresponding die may be the master core die or the slave core die.

The stack state identifier 3037 may output the die attribute signal SLAVE in response to the determination signal DET and the stack enable signal EN3DS.

In example embodiments, when an ID of 00, 01, 10 and 11 may be assigned to the master core die 310 and the slave core dies 320, 330 and 340 and the stack enable signal EN3DS may be activated, the die attribute signal SLAVE may be outputted to a high level only when the corresponding die may not correspond to the master core die 310.

Figure 5:
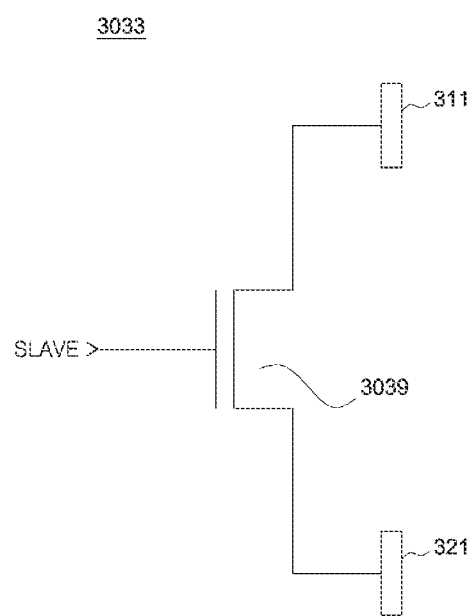
FIG. 5 is a view illustrating a current regulation circuit in accordance with example embodiments.

FIG. 5 is a view illustrating a current regulation circuit in accordance with example embodiments.

Referring to FIG. 5, the current regulation circuit 3033 may include a switch 3039 configured to connect the first power terminal 311 with the second power terminal 321 or to disconnect the first power terminal 311 from the second power terminal 321 in response to the die attribute signal SLAVE.

When the die attribute signal SLAVE having a logic high level may be applied in the slave core dies 320, 330, 340 in the stacked structure 200, the ground voltage VSS may be applied to the first power terminal 311 and the second power terminal 321 of the first circuit 301 to cut off the current consumption of the first circuit 301.

Figure 6:
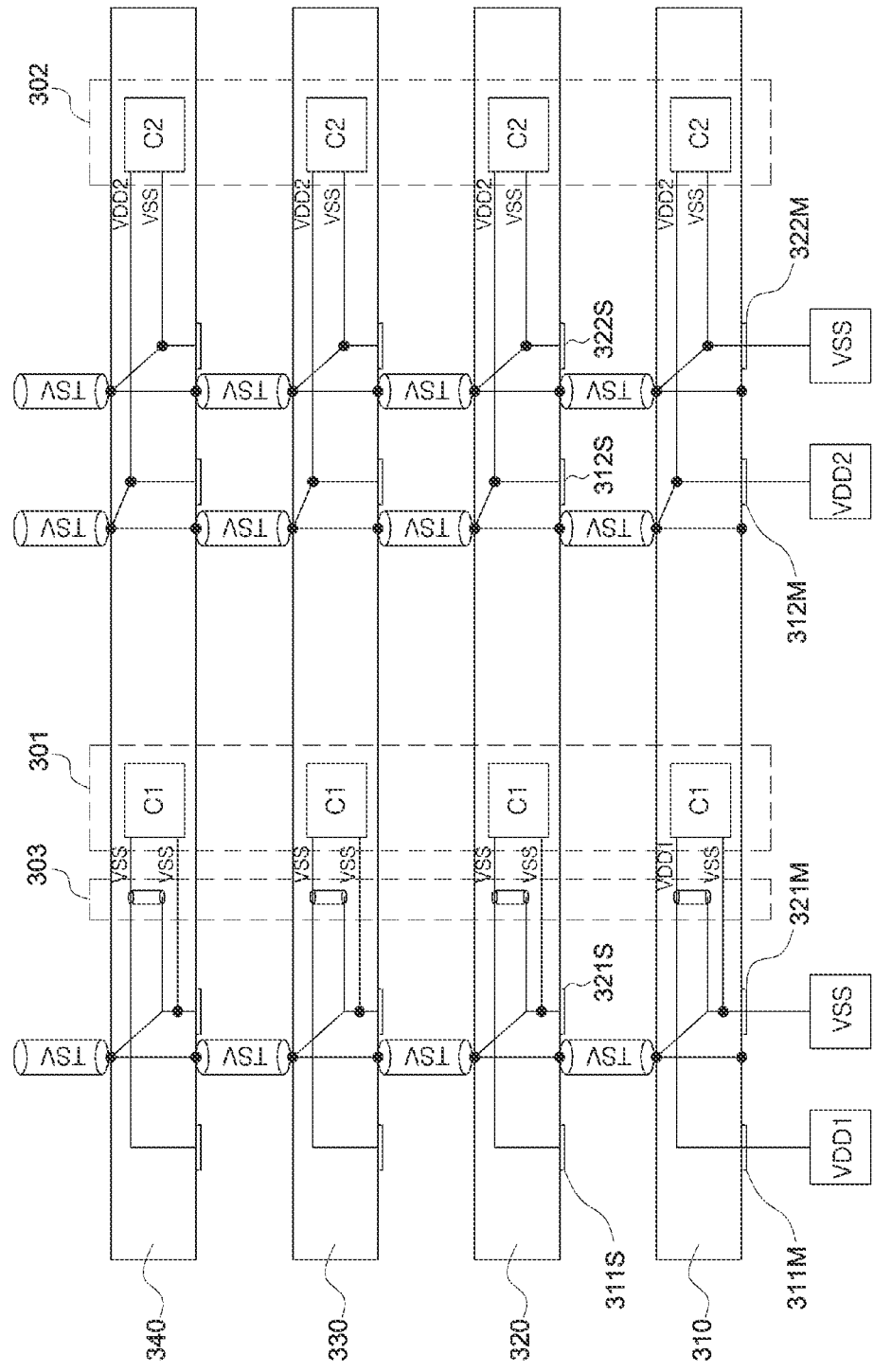
FIG. 6 is a view illustrating a concept for controlling a current in a stacked type semiconductor memory device in accordance with example embodiments.

FIG. 6 is a view illustrating a concept for controlling a current in a stacked type semiconductor memory device in accordance with example embodiments.

Referring to FIG. 6, the first power voltage VDD1 may be applied to the first circuit C1 of the master core die 310 through a first power application pad 311M. The ground voltage VSS may be applied to the first circuit C1 of the master core die 310 through a second power application pad 321M. The second power voltage VDD2 may be applied to the second circuit C2 of the master core die 310 through a third power application pad 312M. The ground voltage VSS may be applied to the second circuit C2 of the master core die 310 through a fourth power application pad 322M.

The ground voltage VSS instead of the first power voltage VDD1 may be applied to a first power application pad 311S of the slave core dies 320, 330 and 340. The ground voltage VSS may be applied to a second power application pad 321S of the slave core dies 320, 330 and 340. Further, the first power terminal 311 of the first circuit C1 may be coupled to the second power terminal 321 by the power control circuit 303 illustrated with reference to FIGS. 2 to 5 so that the ground voltage VSS may be applied to the second power terminal 321. The second power voltage VDD2 may be applied to the second circuit C2 of the slave core dies 320, 330 and 340 through a third power application pad 312S. The ground voltage VSS may be applied to the second circuit C2 of the slave core dies 320, 330 and 340 through a fourth power application pad 322S.

Figure 7:
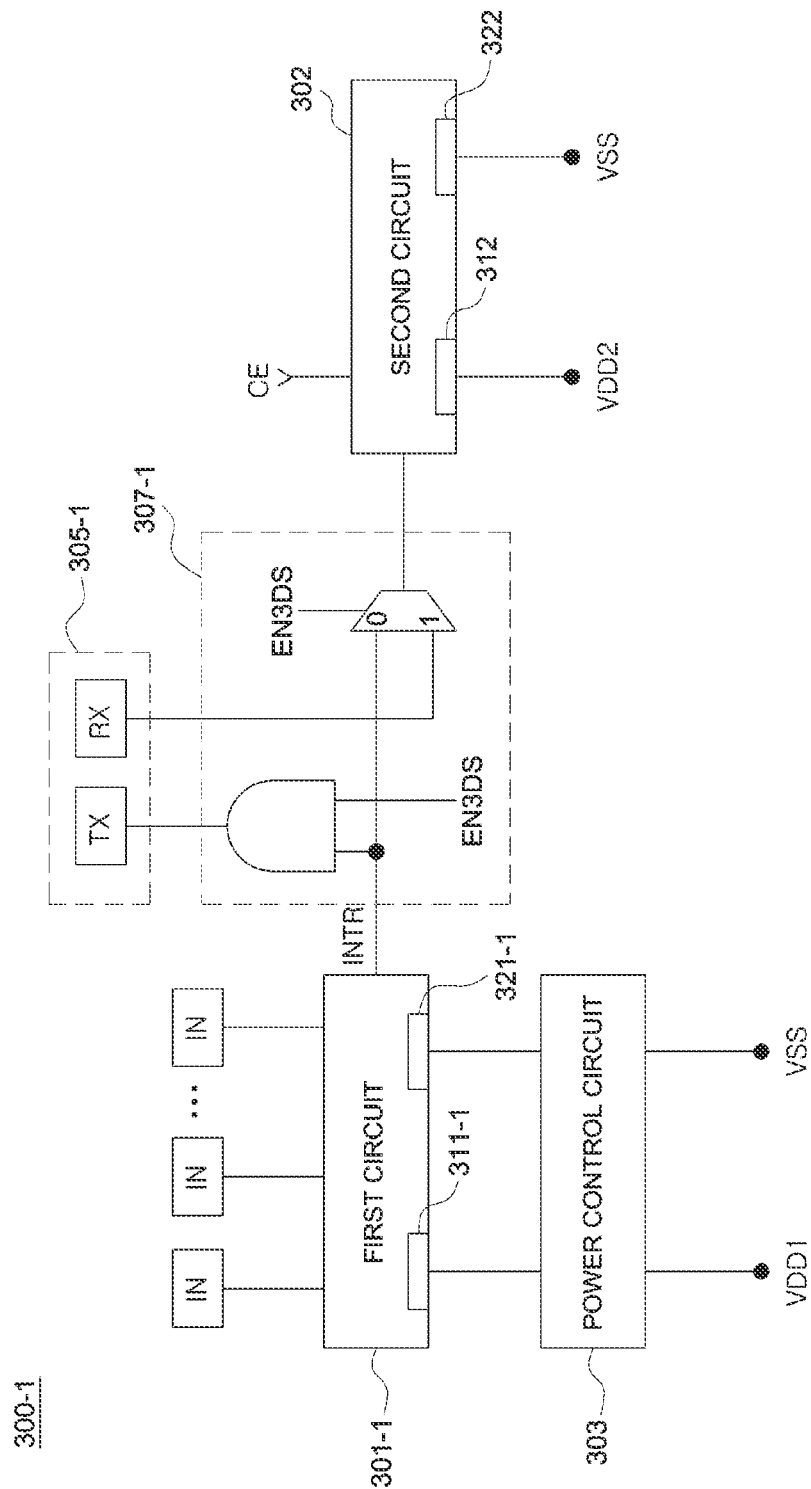
FIGS. 7 and 8 are views illustrating a concept for processing a signal in accordance with an operation domain.
Figure 8:
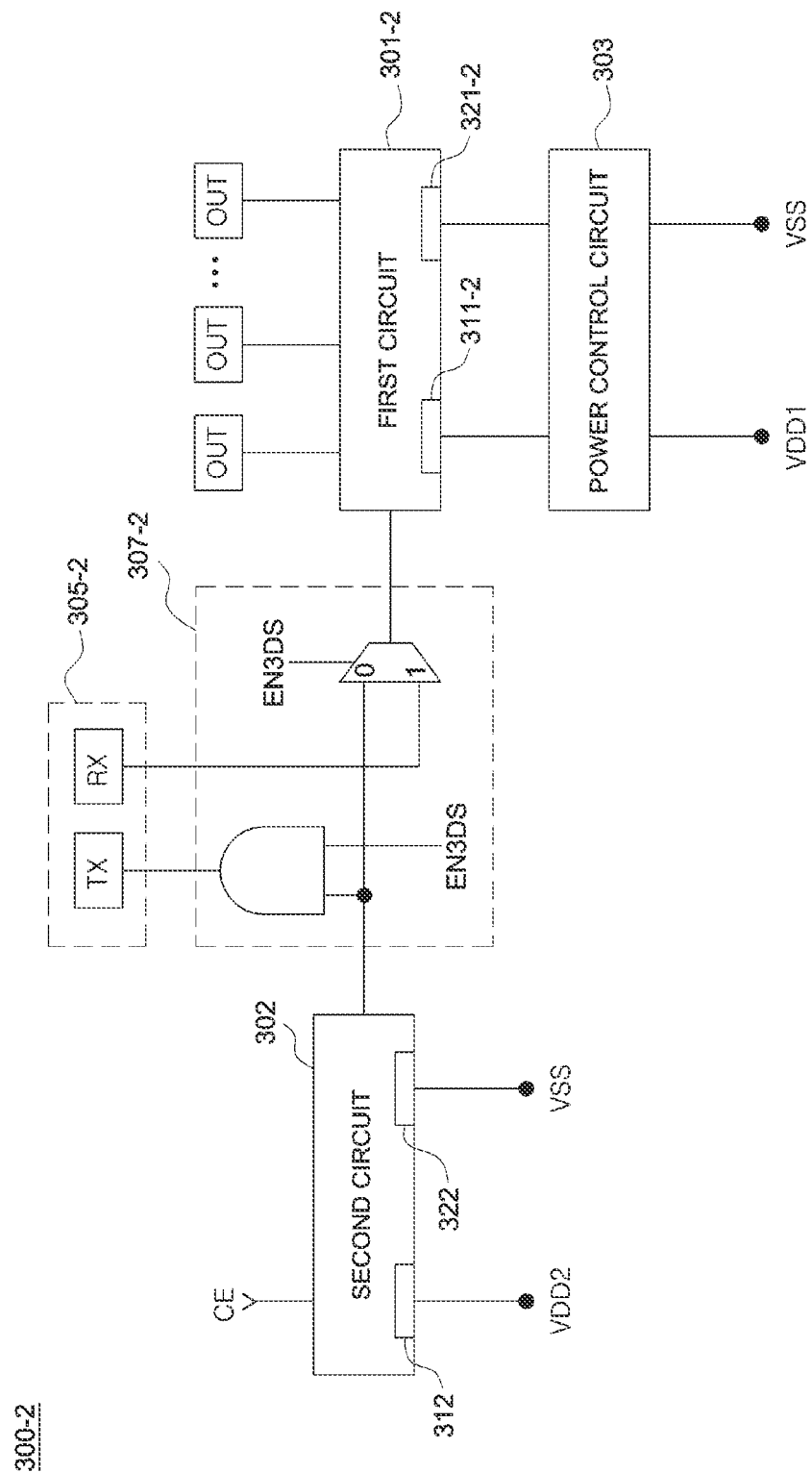

FIGS. 7 and 8 are views illustrating a concept for processing a signal in accordance with an operation domain.

FIG. 7 may show the concept for processing the signal in an input domain.

Referring to FIG. 7, a first buffering circuit 301-1 may buffer or decode a signal provided through a plurality of input pads IN.

When a core die 300-1 in FIG. 7 may correspond to the master core die 310, the first power voltage VDD1 may be applied to a first power terminal 311-1 by the power control circuit 303. The ground voltage VSS may be applied to the second power terminal 321-1 to output an internal signal INTR from the first circuit 301-1.

The internal signal INTR may be transmitted to the slave core dies 320, 330 and 340 through a transmission line 305-1. Further, the internal signal INTR may also be transmitted to a selector 307-1. The selector 307-1 may receive the internal signal INTR and signals from the slave core dies 320, 330 and 340 through the transmission line 305-1. The selector 307-1 may select any one of the internal signal INTR and the signals from the slave core dies 320, 330 and 340 in accordance with the stack enable signal EN3DS.

The second circuit 302 may be activated in accordance with a chip enable signal CE. The second circuit 302 may receive an output signal from the selector 307-1 to perform set operations.

When the core die 300-1 in FIG. 7 may correspond to the slave core dies 320, 330 and 340, the ground voltage VSS may be applied to the first power terminal 311-1 and the second power terminal 321-1 by the power control circuit 303 so that the first circuit 301-1 may be deactivated. The second circuit 302 may receive and process the internal signal INTR from the master core die 310 through the transmission line 305-1.

FIG. 8 may show the concept for processing the signal in an output domain.

Referring to FIG. 8, a first buffering circuit 301-2 may buffer processed results of the second circuit 302 to output a buffered signal through an output pad OUT.

An output signal from the second circuit 302 may be transmitted to the slave core dies 320, 330 and 340 through a transmission line 305-2. Further, the output signal may also be transmitted to a selector 307-2. The selector 307-2 may receive the output signal from the second circuit 302 and signals from the slave core dies 320, 330 and 340 through the transmission line 305-2. The selector 307-2 may select any one of the output signal and the signals from the slave core dies 320, 330 and 340 in accordance with the stack enable signal EN3DS.

When a core die 300-2 in FIG. 8 may correspond to the activated master core die 310, the first power voltage VDD1 may be applied to a first power terminal 311-2 and the ground voltage VSS may be applied to the second power terminal 311-2 by the power control circuit 303. The first circuit 301-2 may output the signal provided from the second circuit 302.

When the core die 300-2 in FIG. 8 may correspond to the inactivated master core die 310, the chip enable signal CE applied to the second circuit 302 may not be activated. The signal transmitted from the slave core dies 320, 330 and 340 through the transmission line 305-2 may be outputted through the first circuit 301-2.

Figure 9:
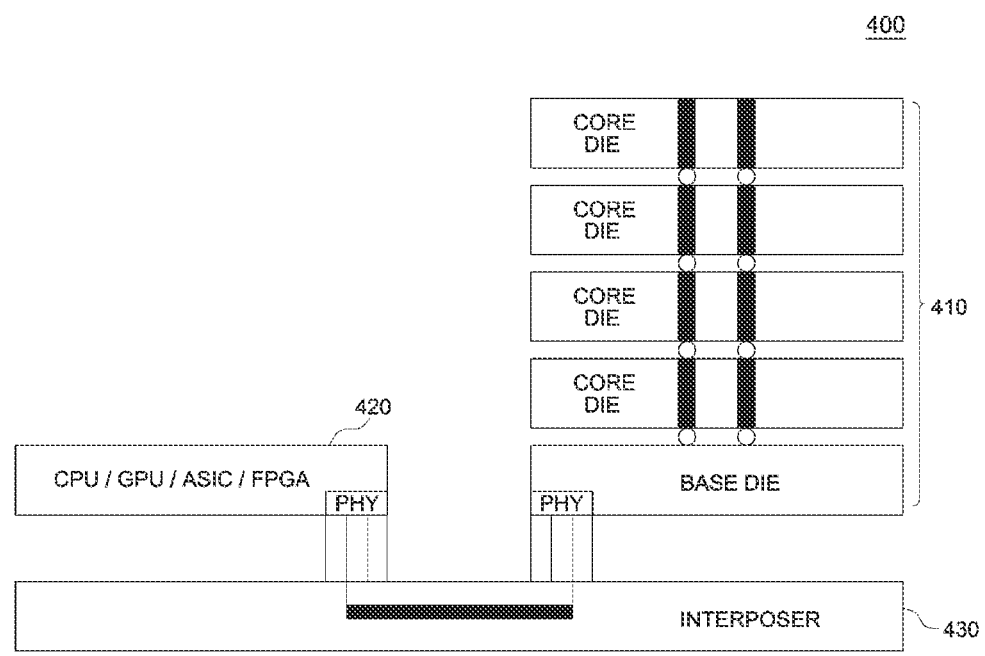
FIGS. 9, 10, and 11 are views illustrating a processing system in accordance with example embodiments.

FIG. 9 illustrates a stacked semiconductor apparatus 400 in accordance with an embodiment.

The stacked semiconductor apparatus 400 may include a stacked structure 410 including a plurality of core dies and a base die, a memory host 420, and an interface substrate (INTERPOSER) 430. The memory host 420 may be a CPU, a GPU, an application specific integrated circuit (ASIC), a field programmable gate array (FPGA) and the like.

The base die may be provided with a circuit for an interface between the core dies and the memory host 420. The stacked structure 410 may have a structure similar to that described with reference to FIGS. 1 to 8.

A physical interface area PHY of the stacked structure 410 and a physical interface area PHY of the memory host 420 may be electrically connected to each other through the interface substrate 430. The interface substrate 430 may be referred to as an interposer.

Figure 10:
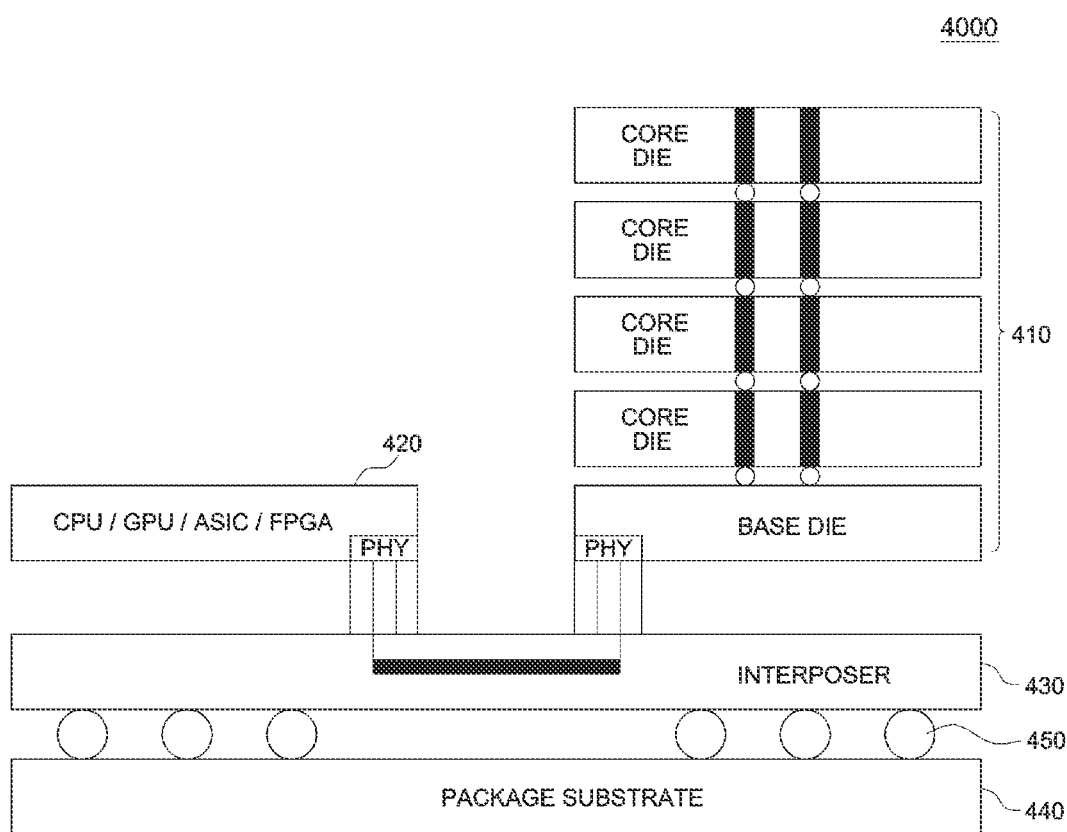

FIG. 10 illustrates a stacked semiconductor apparatus 4000 in accordance with an embodiment.

It may be understood that the stacked semiconductor apparatus 4000 illustrated in FIG. 10 may be obtained by disposing the stacked semiconductor apparatus 400 illustrated in FIG. 9 on a package substrate 440.

The package substrate 440 and the interface substrate 430 may be electrically connected to each other through connection terminals.

A system in package (SiP) type semiconductor apparatus may be implemented by stacking the stacked structure 410 and the memory host 420, which are illustrated in FIG. 9, on the interface substrate 430 and mounting them on the package substrate 440 for the purpose of packaging.

Figure 11:
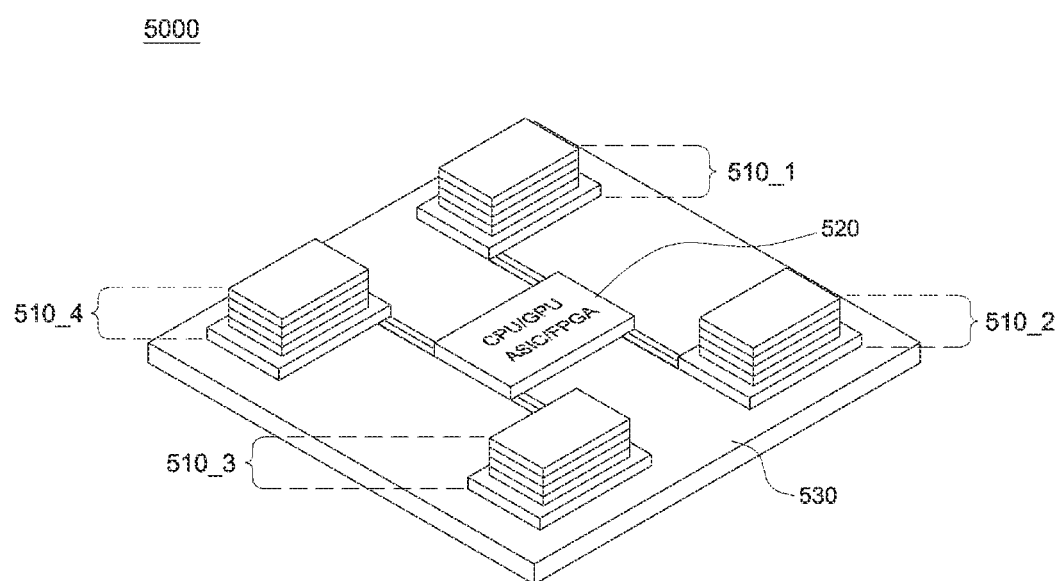

FIG. 11 is a view illustrating a processing system in accordance with example embodiments.

Referring to FIG. 11, a processing system 5000 of example embodiments may include four stacked memory structures 510-1, 510-2, 510-3 and 510-4 connected to at least one main processor 510. The main processor 510 may be arranged on an interposer 530.

Each of the stacked memory structures 510-1, 510-2, 510-3 and 510-4 may include the base die and the plurality of memory dies stacked on the base die of above example embodiments.

The above described embodiments of the present invention are intended to illustrate and not to limit the present invention. Various alternatives and equivalents are possible. The invention is not limited by the embodiments described herein. Nor is the invention limited to any specific type of semiconductor device. Another additions, subtractions, or modifications are obvious in view of the present disclosure and are intended to fall within the scope of the appended claims.

What is claimed is:

1. A power control circuit for a plurality of memory dies, the memory dies configured to form a stacked chip package, wherein identifiers are assigned to the memory dies, and each of the memory dies includes a first circuit and a second circuit, the power control circuit comprising:
   a die determination circuit configured to determine stack positions of the memory dies based on the identifiers of the memory dies to output a die attribute signal; and
   a current regulation circuit configured to apply a first power voltage or a ground voltage to a first power terminal of the first circuit and apply the ground voltage to a second power terminal of the first circuit based on the die attribute signal.

2. The power control circuit of claim 1, wherein the stacked chip package comprises a master core die arranged at a lowermost layer of the stacked chip package and at least one slave core die arranged on the master core die, and the current regulation circuit may apply the first power voltage to the first power terminal when the die attribute signal is outputted.

3. The power control circuit of claim 1, wherein the stacked chip package comprises a master core die arranged at a lowermost layer of the stacked chip package and at least one slave core die arranged on the master core die, and the current regulation circuit is arranged to apply the ground voltage to the first power terminal when the die attribute signal is outputted, wherein the die attribute signal includes information that the core die corresponds to at least one slave core die.

4. A power control circuit for a plurality of memory dies, the memory dies configured to form a stacked chip package, wherein identifiers are assigned to the memory dies, and each of the memory dies includes a first circuit and a second circuit, the first circuit having a first power terminal and a second power terminal, the power control circuit comprising:

a die determination circuit configured to determine stack positions of the memory dies based on the identifiers of the memory dies to output a die attribute signal; and a current regulation circuit comprising a switch configured to connect the first power terminal with the second power terminal or disconnect the first power terminal from the second power terminal in response to the die attribute signal, wherein a ground voltage may be applied to the first power terminal and the second power terminal to cut off current consumption of the first circuit in response to the die attribute signal.

5. The power control circuit of claim 4, wherein the stacked chip package comprises a master core die directly stacked on a base die and at least one slave core die configured to transmit and receive signals with the base die through the master core die, wherein the current regulation circuit is configured to connect the first power terminal with the second power terminal of the first circuit comprised in each of the slave core die.

* * * * *